United States Patent [19]

Cockrum et al.

[11] Patent Number: 5,401,986
[45] Date of Patent: Mar. 28, 1995

[54] BAKE-STABLE HGCDTE PHOTODETECTOR WITH II-VI PASSIVATION LAYER

[75] Inventors: Charles A. Cockrum; Frrancis I. Gesswein, both of Goleta; Eric F. Schulte, Santa Barbara, all of Calif.

[73] Assignee: Santa Barbara Research Center, Goleta, Calif.

[21] Appl. No.: 270,527

[22] Filed: Jul. 5, 1994

Related U.S. Application Data

[60] Continuation of Ser. No. 188,172, Jan. 26, 1994, abandoned, which is a division of Ser. No. 917,562, Jul. 21, 1991, Pat. No. 5,296,384.

[51] Int. Cl.⁶ .......................................... H01L 27/14
[52] U.S. Cl. .................................. 257/188; 257/201; 257/441; 257/442; 257/466; 136/256
[58] Field of Search ............... 257/441, 442, 466, 184, 257/188, 189, 631, 201; 136/256

[56] References Cited

U.S. PATENT DOCUMENTS

| Re. 30,412 | 10/1980 | Raychaudhuri | 136/260 |
|---|---|---|---|
| 3,845,494 | 10/1974 | Ameurlaine et al. | 357/30 |
| 3,988,774 | 10/1976 | Cohen-Solal et al. | 357/30 |
| 4,085,500 | 4/1978 | Hager et al. | 437/185 |
| 4,132,999 | 1/1979 | Maille | 357/30 |
| 4,206,003 | 6/1980 | Koehler | 148/1.5 |
| 4,439,912 | 4/1984 | Pollard et al. | 29/572 |
| 4,549,195 | 10/1985 | Bluzer | 257/442 |
| 4,611,091 | 9/1986 | Choudary | 136/260 |
| 4,639,756 | 1/1987 | Rosbeck et al. | 257/442 |
| 4,735,662 | 4/1988 | Szabo et al. | 136/260 |
| 4,764,261 | 8/1988 | Ondris et al. | 437/5 |
| 4,766,084 | 8/1988 | Bory et al. | 437/3 |
| 4,818,565 | 4/1989 | Franciosi | 437/185 |
| 4,865,245 | 9/1989 | Schulte et al. | 228/116 |
| 5,144,138 | 9/1992 | Kinch et al. | 437/5 |
| 5,168,338 | 12/1992 | Kumada et al. | 307/311 |
| 5,189,297 | 2/1993 | Ahlgren | 250/214 |
| 5,192,695 | 3/1993 | Wang et al. | 437/5 |
| 5,279,974 | 1/1994 | Walsh | 257/442 X |

FOREIGN PATENT DOCUMENTS

| 0045258 | 2/1982 | European Pat. Off. | 257/188 |
|---|---|---|---|
| 0518243 | 12/1992 | European Pat. Off. | |
| 2336804 | 12/1975 | France | 31/6 |
| 2739309 | 9/1977 | Germany | |
| 60-3165 | 9/1985 | Japan | H01L 31/10 |
| 1223779 | 9/1989 | Japan | 257/442 |
| 1251672 | 10/1989 | Japan | 257/188 |
| 3196683 | 8/1991 | Japan | 257/442 |
| 2100927 | 6/1982 | United Kingdom | H01L 31/06 |
| WO87/07083 | 11/1987 | WIPO | 31/103 |

Primary Examiner—William Mintel
Attorney, Agent, or Firm—W. C. Schubert; W. K. Denson-Low

[57] ABSTRACT

A photoresponsive device wherein the device includes semiconductor material, such as a cap region (14a), comprised of elements selected from Group IIB-VIA. A molybdenum contact pad (16) is formed upon a surface of the cap region, and a molybdenum ground contact pad is formed on a surface of a base region (12). A wide bandgap semiconductor passivation layer (20) overlies the surface of the cap region and also partially overlies the molybdenum contact pad. A dielectric layer (22) overlies the passivation layer, and an indium bump (24) is formed upon the molybdenum contact pad. The dielectric layer is in intimate contact with side surfaces of the indium bump such that no portion of the molybdenum contact pad can be physically contacted from a top surface of the dielectric layer. This method eliminates the possibility of unwanted chemical reactions occurring between the In and the underlying contact pad metal. The method also deposits the contact metal before the deposition of the passivation and before a high temperature anneal, with windows to the contact being opened after the anneal so as to reduce localized stresses at the edges of the windows.

16 Claims, 3 Drawing Sheets

BAKE-STABLE HGCDTE PHOTODETECTOR WITH II-VI PASSIVATION LAYER

This is a continuation of application Ser. No. 188,172, filed Jan. 26, 1994, now abandoned, which is a division of application Ser. No. 917,562, filed Jul. 21, 1992, now U.S. Pat. No. 5,296,384.

FIELD OF THE INVENTION

This invention relates generally to radiation sensors and, in particular, to methods for fabricating infrared radiation (IR) sensors comprised of semiconductor materials selected from Group IIB-VIA of the periodic table.

BACKGROUND OF THE INVENTION

Known types of contact metals used for photovoltaic (PV) mercury-cadmium-telluride (HgCdTe) IR sensors include gold (Au) with a nickel (Ni) overcoat, for individual p-type contacts, and palladium (Pd) with a Ni overcoat for n-type ground (common) contacts. However, during high temperature storage both Au and Pd are known to diffuse into HgCdTe, causing a high density of dislocations, in the case of Pd, and shorting out the p-n junction, in the case of Au. Both of these unwanted diffusions result in degraded device performance and poor high temperature (bake) stability. Furthermore, the use of Au/Ni contacts for the p-type material and Pd/Ni for the n-type material requires two separate photolithographic and deposition processes. Also, the Au/Ni and Pd/Ni metal systems each have a coefficient of thermal expansion (CTE) that differs significantly from the CTE of HgCdTe. As a result, stress is applied to the HgCdTe during thermal cycling. It is also known to employ an annealed, wide bandgap semiconductor passivation layer comprised of, by example, cadmium-telluride (CdTe) with the aforementioned contact metals. In that an as-deposited CdTe film contains residual crystal lattice stress, thermal annealing reduces the stress in the CdTe to approximately 10% of its as-deposited value. Annealing of the CdTe passivation is conventionally performed prior to depositing the contact metalization, and requires openings, or windows, to be etched through the passivation film before annealing. However, etching openings in the passivation film results in undesirable stress concentrations at the edges of the openings, thereby degrading the underlying HgCdTe material.

As a result, Dewar bake-out temperatures are typically limited to 100° C. or less because of the instabilities in the surface passivation and/or the undesired diffusion of contact metal.

Furthermore, in that Hg is known to diffuse through a CdTe passivation layer during high temperature storage, a desired stoichiometric ratio of Group IIB-VIA material is not preserved within the radiation sensor device, over a prolonged period of high temperature storage.

A further problem that arises during the processing of conventional IR detector arrays relates to two unwanted chemical reactions that occur during an etch process that is used to remove oxide from indium (In) bumps, in preparation for hybridization of the array with other circuitry. By example, one suitable etch process is described in commonly assigned U.S. Pat. No. 4,865,245, issued to E.F. Schulte et al..

More specifically, it has been discovered that during the etch an electrochemical cell is formed between the In bump and the contact metal upon which the bump is deposited. The etchant, for example HCl, acts as the electrolyte. The result is that the etch rate of the In is increased in proportion to (a) the surface area of exposed contact metal, and (b) the difference in electronegativity between the contact metal and the In. As a result, the amount of In removed during the etch may vary over the surface of an array. The greatest In removal has been found to occur around the periphery of the array, where large amounts of ground contact metal are typically exposed. The degradation of the In bumps is especially troublesome for those In bumps around the outer periphery of the array, as these bumps are most prone to failure after prolonged thermal cycling of the hybrid assembly.

The second unwanted chemical reaction results in the formation of electrically conductive In-Te whiskers on the surface of the CdTe passivation layer.

The following patents are cited as relating to Group IIB-VIA photodetector fabrication techniques.

U.S. Pat. No. 4,439,912 (Pollard et al.) teaches the use of a molybdenum (Mo) layer that is overcoated with an Au/Ge layer to form connecting leads to a HgCdTe epitaxial detector array that is formed on a CdTe substrate. The leads are said to have excellent matches for the CTEs of HgCdTe and CdTe. Portions of the leads are masked prior to depositing a ZnS passivation layer. JP 60-3165(A) (Takeda) discloses, in the Abstract, the deposition, after a heat treatment, of a Mo electrode upon a (CdZnTe)(InTe) photoconductor layer. U.S. Pat. No. 4,766,084 (Bory et al.) teaches the deposition and etching of Cr and Au to form conductive pads. FIG. 2 illustrates a HgCdTe diode having an insulating layer that may be $SiO_2$ and $Si_3N_4$, $SiO_2$ and ZnS, or CdTe and ZnS. In U.S. Pat. No. 4,206,003 T. Koehler describes a HgCdTe diode having a ZnS encapsulation layer that overlies an anodic oxide passivation layer. U.S. Pat. No. 4,132,999 (Maille' et al.) describes a PV detector having a HgCdTe substrate, a CdTe transition layer, and a masking layer comprised of ZnS, $SiO_2$, SiO, or $Si_3N_4$. After a heat treatment a window is opened to enable a doping impurity to be diffused into the HgCdTe. A protective layer of CdTe is then deposited over the masking layer and the window, Hg is diffused in through the window, an aperture is opened through the protective layer, and Cr or Au contacts are formed. U.S. Pat. No. 3,988,774 (Cohen-Solal et al.) describes a body of HgCdTe having an intermediate layer of HgCdTe or CdTe deposited thereon. Following a heat treatment windows are opened, dopants are diffused into the HgCdTe body, and Cr and Au contacts are formed. In U.S. Pat. No. 3,845,494, J. Ameurlaine et al. describe a HgCd-CdTe PV detector having Au electrodes formed on opposite faces. After forming the electrodes a Hg-impervious layer of ZnS is applied. In GB-2100927 A. Dean et al. describe a CdHgTe photodiode having a CdTe passivating layer. After a heat treatment, an Au electrode is formed through apertures in the CdTe.

What is not taught by these various U.S. and foreign Patents, and what is thus one object of this invention to provide, is a radiation sensor fabrication method, and a radiation sensor formed thereby, that deposits contact metal before the deposition of a wide bandgap semiconductor passivation layer or film, with windows to the contact metal being opened in the film after a thermal annealing step so as to significantly minimize localized stresses at the edges of the windows.

A further object of this invention is to provide a fabrication process that employs a contact metal selected to have a CTE that more closely equals that of HgCdTe, and to apply the selected contact metal prior to the deposition of a semiconductor passivation layer and a subsequent thermal anneal.

A still further object of this invention is to provide a fabrication process that significantly reduces or eliminates the possibility of unwanted chemical reactions degrading In bump interconnects during a hybridization process, thereby increasing the reliability of a resulting radiation detector hybrid assembly.

SUMMARY OF THE INVENTION

The foregoing and other problems are overcome and the objects of the invention are realized by a HgCdTe IR detector fabrication process that combines passivation and contact metalization to both the p and n sides of a photodiode junction, with the contact metal being applied before the passivation film and before a high temperature anneal. The method also includes the fabrication of a layer of dielectric overglass to eliminate the occurrence of undesirable chemical reactions during a hybridization process, and to also prevent Hg from diffusing through the passivation during high temperature storage.

Applying a non-reactive, non-diffusing contact metal before annealing at high temperatures provides several advantages. First, it ensures that the interface between the metal and the semiconductor does not change during subsequent processing and use, thus guaranteeing a reliable contact system. For example, degradation caused by the diffusion of contact metal into the device during Dewar bake-out cycles is eliminated. Second, stress in the as-deposited metal film is relieved by the anneal cycle, thus improving adhesion and overall device reliability. Third, the use of a refractory metal system that is compatible with high temperature annealing simplifies other device fabrication processes. For example, by applying the contact metal first, the entire PV HgCdTe array is overcoated with a wide bandgap semiconductor material, and is then annealed.

In addition to creating a device which is bake-stable to temperatures in excess of 150° C., the method of the invention also minimizes the effect of stress in the wide bandgap semiconductor film. This is accomplished by not forming openings, or windows, in the passivation film until after an anneal cycle, thereby reducing localized stress in the underlying HgCdTe material. The contact metal also beneficially serves as an etch stop for a chemical etch process that forms the openings, or windows, through the wide bandgap semiconductor material to the underlying contacts.

The method of the invention also provides that only the In bumps, and not the underlying contact metal, are exposed during a wet chemical etch that is performed, prior to hybridization, to remove oxides from the In bumps. The use of a dielectric layer (overglass) surrounding the In bumps eliminates the chemical and electrochemical reactions that occur during the etching process.

More specifically, the invention teaches a photoresponsive device and an array of photoresponsive devices, either photovoltaic or photoconductive, and a method of fabricating same. The device includes semiconductor material, such as a cap region, that is comprised of elements selected from Group IIB-VIA. A non-diffusing, non-reactive metal contact pad is formed upon a surface of the cap region. A presently preferred material for the contact pad is molybdenum. A wide bandgap semiconductor passivation layer overlies the surface of the cap region and also partially overlies the contact pad. A dielectric layer overlies the passivation layer, and an indium bump is formed upon the contact pad. The indium bump extends upwardly from the contact pad and through the dielectric layer. The dielectric layer is in intimate contact with side surfaces of the indium bump such that no portion of the contact pad can be physically contacted from a top surface of the dielectric layer.

The method thus eliminates a possibility of unwanted chemical reactions occurring between the In and the underlying contact pad metal during a hybridization process. The method also deposits the contact pad metal before the deposition of the semiconductor passivation material and before a high temperature anneal, with windows to the contact pad being opened after the anneal so as to reduce localized stresses at the edges of the windows.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Although described below in the context of a fabrication process for PV detectors having a mesa geometry, it should be realized that the teaching of the invention is applicable also to planar arrays of PV detectors, and also to the fabrication of photoconductive (PC) IR detectors comprised of Group IIB-VIA semiconductor material.

Figure 1:
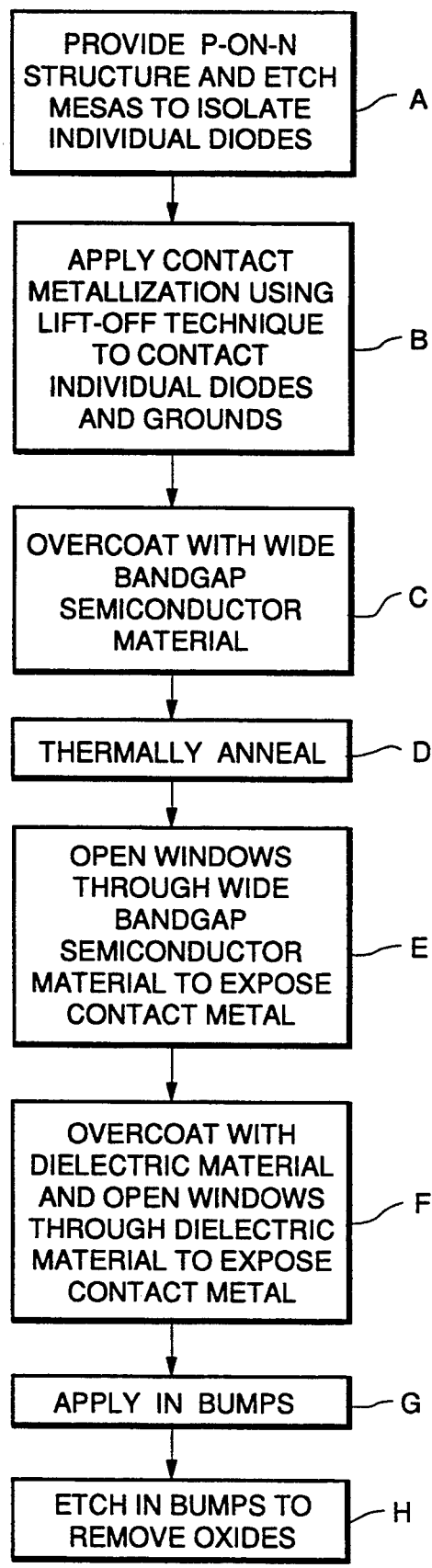
FIG. 1 is a process flow diagram depicting the steps of the method of the invention.

Reference is made to the process flow diagram of FIG. 1, in conjunction with the various cross-sectional views of FIGS. 2a–2g. In FIGS. 2a–2g a portion of an array, specifically two mesa structures, is shown. It should be realized that a typical array of radiation detectors would comprise a significantly larger number of mesa structures arranged in a linear or a two-dimensional array.

(FIG. 1 - Block A) Processing begins with an n-type radiation absorbing HgCdTe base layer 12 that is grown on an electrically insulating and transparent substrate 10. Substrate 10 is selected to be transparent at wavelengths of interest, specifically those wavelengths that are desired to be absorbed within the base layer 12. A preferred method for growing the base layer 12 on the substrate 10 is by Liquid Phase Epitaxy (LPE), although Molecular Beam Epitaxy (MBE) and Metal-Organic Chemical Vapor Deposition (MOCVD) are also suitable growth techniques. A suitable material for the substrate 10 is CdZnTe. The bandgap of the HgCdTe semiconductor material of the base layer 12 is selected for absorbing radiation having the wavelengths of interest and is set, in a known fashion, by varying the relative concentrations of the Hg and Cd atoms in accordance with the formula: $Hg_{(1-x)}Cd_{(x)}Te$, wherein (x) is a nonzero number that is less than one. Upon the base layer 12 is then epitaxially grown a p-type HgCdTe cap layer 14. The cap layer 14 may be grown, by example, by LPE, MBE, or by MOCVD. A suitable dopant species for the base layer 12 is indium having a concentration of approximately $10^{15}$ atoms/cm$^3$. A suitable dopant species for the cap layer 14 is arsenic having a concentration of approximately $10^{18}$ atoms/cm$^3$. Individual photodiodes are delineated by a mesa etch process, using bromine/ethyleneglycol or bromine/methanol, in conjunction with a photolithographically applied mask. The result of the mesa etch is to differentiate the p-type cap layer into a plurality of electrically isolated regions 14a, each of the regions 14a being contained within a mesa and forming a p-n junction with the underlying n-type base layer 12. (FIG. 1 - Block B, FIG. 2b) A next step of the method applies, to each of the cap layers 14a, a metal contact pad 16. A common contact pad 18 is also applied to the n-type HgCdTe base layer 12. In accordance with an aspect of the invention, the metal contact pad is comprised of a refractory metal selected to have a low diffusion characteristic, at elevated temperatures, so as to prevent the diffusion of the contact metal into the underlying HgCdTe cap layer 14a. A presently preferred metal is Mo. A further advantage of Mo is that it exhibits a CTE that is more closely matched to the HgCdTe than is the CTE of many commonly used contact metals, such as Cr and Au. As a result, when the structure is heated the Mo contacts tend not to exert undesirable stresses on the underlying semiconductor material. A presently preferred technique deposits the Mo contact metalization by sputter deposition and a lift-off process. A suitable thickness for the contact pads 16 and 18 is approximately 1500 Angstroms.

Figure 2A:
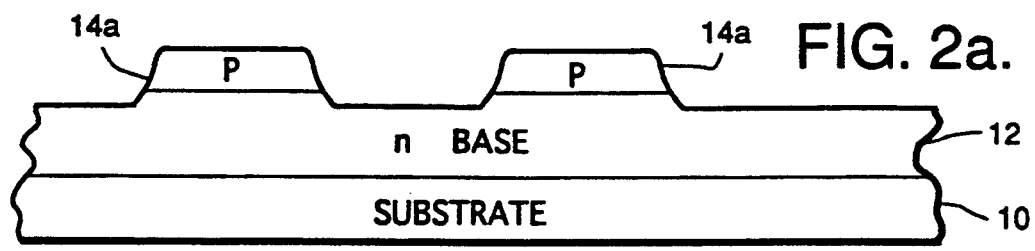
FIGS. 2a–2g are each a cross-sectional view, not to scale, showing the fabrication of a photodiode array in accordance with the method of the invention.
Figure 2B:
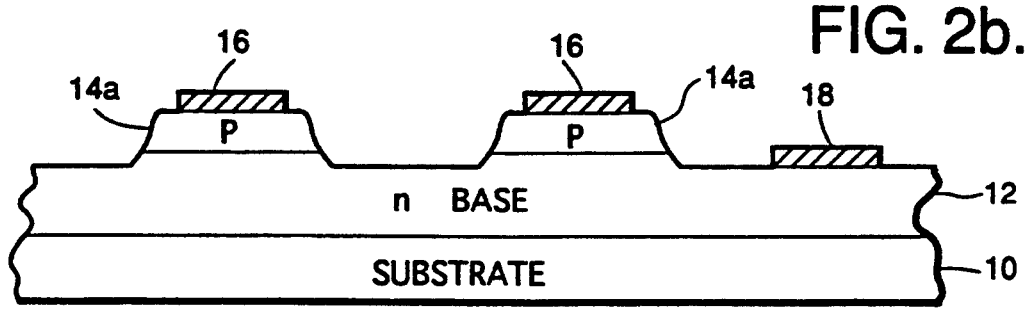
Figure 2C:
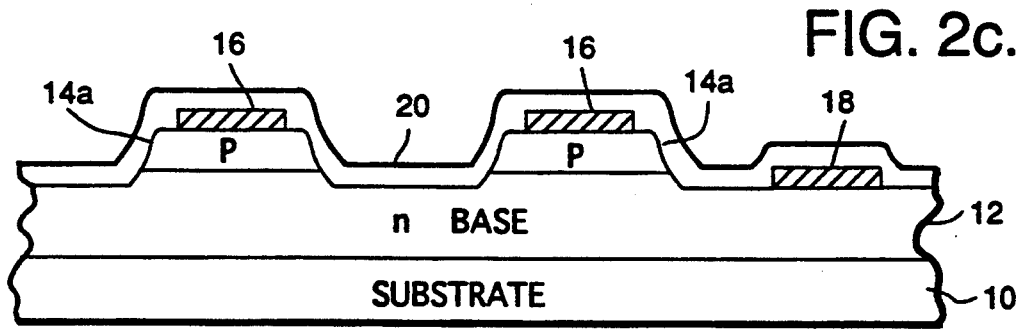

(FIG. 1 - Block C, FIG. 2c) A next step overcoats the structure formed thus far with a layer 20 of wide bandgap Group IIB-VIA semiconductor material. This wide bandgap semiconductor material may be, by example, CdTe, CdZnTe, or CdSeTe. A presently preferred technique is to blanket deposit CdTe to a depth of approximately 4000 Angstroms by a thermal evaporation process. Other suitable deposition techniques include MBE, MOCVD, and sputtering. As can be seen in FIG. 2c, the effect of this step is to cover the exposed surface of the n-type base layer 12, the exposed surfaces of the p-type cap layers 14a, and also the Mo contacts 16 and 18, with a layer or film of the wide bandgap semiconductor material.

Figure 2D:
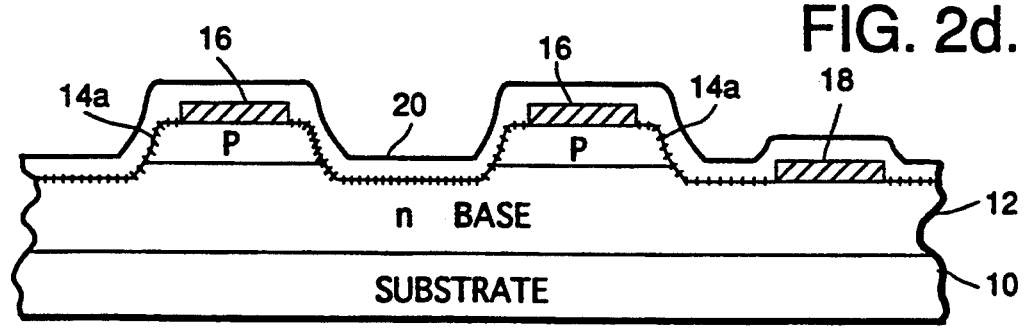
Figure 2E:
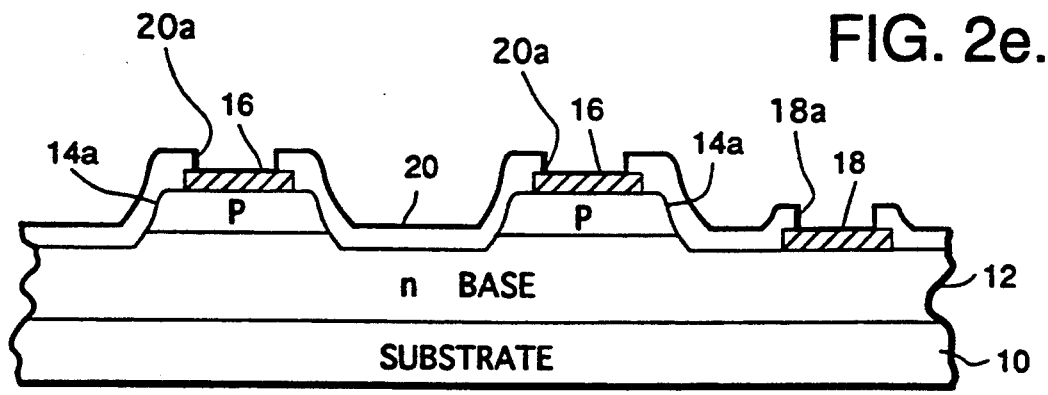
Figure 2F:
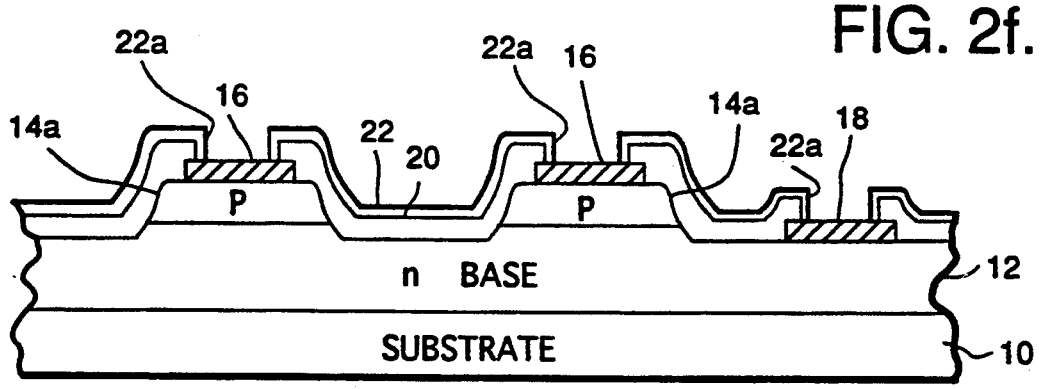

(FIG. 1 - Block D, FIG. 2d) A next step anneals the structure formed thus far in Hg vapor at a first temperature for a first period of time and then at a second, lower temperature for a second period of time. In general, both the first and the second temperatures are greater than a temperature used during a subsequent Dewar bake-out process. That is, both the first and the second temperatures are greater than approximately 150° C. One result of the anneal is to interchange Hg and Cd at cation sites along an interface between the layers 12 and 14a and the layer 20. This interface region is shown in FIG. 2d in a crosshatched manner. (FIG. 1 - Block E, FIG. 2e) After annealing the structure, windows 20a are opened through the layer 20 to expose the Mo contacts 16 and 18. One suitable technique for opening the windows 20a is to employ photoresist patterning in conjunction with a wet chemical etch. Two suitable wet etchants are Br/ethyleneglycol and Br/methanol. The windows 20a may also be opened by ion beam milling or by a reactive ion etch process. The Mo contacts 16 and 18 beneficially function as etch stops for the etching process. The photoresist mask is stripped after opening the windows 20a.

(FIG. 1 - Block F, FIG. 2f) The structure is next overcoated with a dielectric layer 22 comprised of, by example, $Si_3N_4$, $SiO_2$, or SiO. A suitable method for depositing the dielectric layer 22 is by a plasma process that deposits the layer to a thickness of approximately 1000 Angstroms. Next, a photoresist patterning step provides an apertured mask, and windows 22a are opened through the dielectric layer 22 to expose the Mo contacts 16 and 18. One suitable technique for opening the windows 22a is to employ photoresist patterning with a wet chemical etch. $CF_4$ is one suitable wet etchant. The photoresist mask is stripped after opening the windows 22a.

Figure 2G:
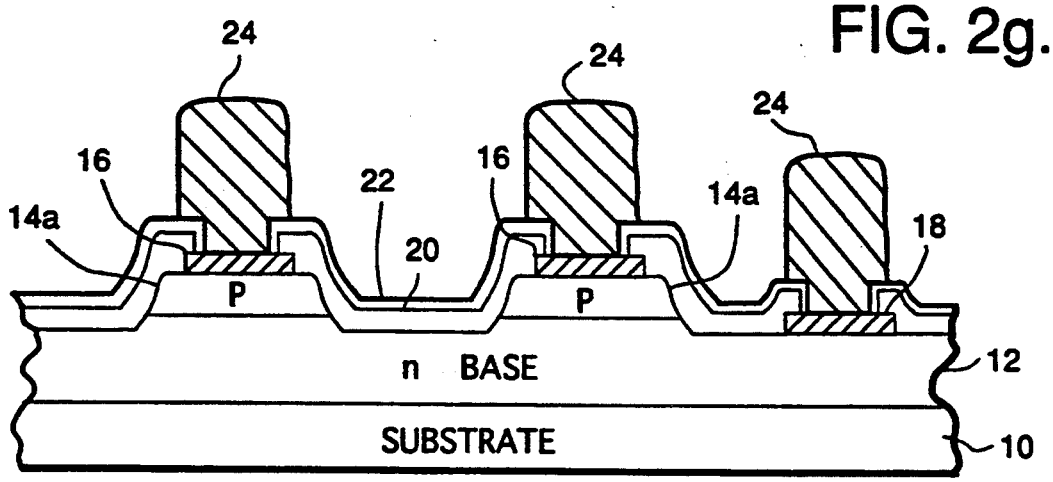

(FIG. 1 - Block G, FIG. 2g) The structure is photolithographically patterned to provide an indium bump mask, and indium bumps 24 are applied to contact individual ones of the photodiode Mo contact pads 16, and to the common Mo contact pad(s) 18, through the windows 22a. One suitable method forms the indium bumps 24 to a thickness of approximately 12 microns through the use of a thermal evaporation technique. As can be seen in FIG. 2g, as a result of this step only the In bumps 24 are left exposed, with the underlying Mo contact metalization being buried beneath the dielectric layer 22. The dielectric layer 22, or overglass, is also substantially impervious to the passage of Hg, and thus beneficially prevents the out-diffusion of Hg from the base layer 12 and the regions 14a.

(FIG. 1 - Block H) At some subsequent time the array of PV diodes thus formed is mated to, or hybridized with, a readout circuit through the In bumps 24. Prior to joining the array to the readout circuit the In bumps 24 are chemically wet etched to remove any surface oxides that would adversely affect the contact resistance. An etching procedure such as that described in the aforementioned commonly assigned U.S. Pat. No. 4,865,245, issued to E.F. Schulte et al., may be employed.

In accordance with an aspect of the invention only the In bumps 24 are exposed to the etchant, the underlying contact metalization being buried beneath the dielectric layer 22. As a result, the aforementioned problems resulting from the proximity of two dissimilar metals are overcome, the In bumps 24 are uniformly etched over the surface of the array, and In-Te whiskers are not produced. The use of the method of the invention thus improves the yield of IR detector arrays by improving the In bump 24 quality during the hybridization process, and also improves reliability by ensuring that the size and shape of the In bumps 24 is maintained at their design dimensions.

In accordance with another aspect of the invention, the anneal in FIG. 2d is performed with a CdTe layer 20 that is substantially continuous across the entire surface of the array. This overcomes the above noted problem that results from annealing with an etched CdTe film. That is, localized stresses in the underlying HgCdTe material, associated with openings in the CdTe film, are not generated.

It has been found that arrays of PV diodes fabricated in accordance with the invention exhibit stable performance after a 74 hour vacuum bake (Dewar bake-out) at 145° C. Heretofore, bake temperatures have been limited to 100° C. or less because of the above mentioned instabilities in the surface passivation and/or the diffusion of the contact metal into the HgCdTe. Also, in that both the passivation layer 20 and the Mo contact metal were previously annealed at a substantially higher temperature, neither is expected to change significantly at storage or processing temperatures that are less than the anneal temperature.

It should be realized that although the invention has been described in the context of specific materials, specific dimensions, and specific processing parameters, such as etchants and deposition techniques, a number of modifications to these various materials, dimensions, and processing parameters may be made, while still obtaining the same result. Furthermore, the teaching of the invention is also applicable to n-on-p devices and also to photoconductive, as opposed to photovoltaic, devices. The teaching of the invention is also applicable to photoresponsive devices having a planar configuration, wherein a p-n junction is formed within a body of HgCdTe through a diffusion or implantation of an acceptor or a donor species into the body.

Thus, while the invention has been particularly shown and described with respect to a preferred embodiment thereof, it will be understood by those skilled in the art that changes in form and details may be made therein without departing from the scope and spirit of the invention.

What is claimed is:

1. A photoresponsive device, comprising:
    a semiconductor body comprised of elements selected from Group IIB-VIA;
    An electrically conductive contact pad formed upon a surface of said semiconductor body; and
    a passivation layer overlying said surface of said semiconductor body; and
    said passivation layer also partially overlying said contact pad, the passivation layer including elements selected from Group IIB-VIA, the device being annealed so as to cause interdiffusion between the semiconductor body and the passivation layer, so that the passivation layer has a wider bandgap than a bandgap of said semiconductor body.

2. A photoresponsive device as set forth in claim 1 wherein said electrically conductive contact pad is comprised of molybdenum.

3. A photoresponsive device as set forth in claim 1 and further including a dielectric layer overlying said passivation layer; and an indium bump disposed upon said contact pad, said indium bump extending upwardly from said contact pad and through said dielectric layer, wherein said dielectric layer is in intimate contact with side surfaces of said indium bump such that no portion of said contact pad may be physically contacted from a top surface of said dielectric layer.

4. A photoresponsive device as set forth in claim 1 wherein said device is a photovoltaic device that includes a p-n junction.

5. A photoresponsive device as set forth in claim 4 wherein said p-n junction is contained within a mesa structure.

6. A photoresponsive device as set forth in claim 4 wherein said p-n junction is contained within said body of semiconductor material, and wherein said device has a planar geometry.

7. A photoresponsive device as set forth in claim 1 wherein said device is a photoconductive device.

8. A photodiode, comprising:
    a substrate;
    a semiconductor base region overlying the substrate and comprising elements selected from Group IIB-VIA, said base region having a first type of electrical conductivity;
    a semiconductor cap region disposed upon said base region, said cap region being comprised of elements selected from Group IIB-VIA, said cap region having a second type of electrical conductivity and forming a p-n junction with said base region;
    an electrically conductive metal contact pad formed upon a top surface of said cap region;
    a semiconductor layer overlying said base region, said cap region, and also partially overlying said metal contact pad, the semiconductor layer comprising elements selected from Group IIB-VIA, said semiconductor layer having a wider bandgap than a bandgap of said base region and said cap region;
    a dielectric layer overlying said semiconductor layer; and
    an electrically conductive interconnect formed upon said metal contact pad, said interconnect extending upwardly from said metal contact pad and through said dielectric layer.

9. A photodiode as set forth in claim 8 wherein said dielectric layer is in intimate contact with side surfaces of said interconnect such that no portion of said metal contact pad may be physically contacted from a top surface of said dielectric layer.

10. A photodiode as set forth in claim 8 wherein said substrate is comprised of elements selected from Group IIB-VIA.

11. A photodiode as set forth in claim 8 and further comprising:
    a second electrically conductive metal contact pad formed upon a top surface of said base region; and
    a second electrically conductive interconnect formed upon said second metal contact pad, said second interconnect extending upwardly from said second metal contact pad and through said dielectric layer, wherein said dielectric layer is in intimate contact with side surfaces of said second interconnect such that no portion of said second metal contact pad is accessible from the top surface of said dielectric layer.

12. A photodiode as set forth in claim 8 wherein said base region is comprised of n-type HgCdTe, and wherein said cap region is comprised of p-type HgCdTe.

13. A photodiode as set forth in claim 8 wherein said semiconductor layer is comprised of material selected from the group consisting essentially of CdTe, CdSeTe, and CdZnTe.

14. A photodiode as set forth in claim 8 wherein said dielectric layer is comprised of material selected from the group consisting essentially of $SiO_2$, SiO, and $Si_3N_4$.

15. A photodiode as set forth in claim 11 wherein said metal contact pad and said second metal contact pad are each comprised of molybdenum.

16. A photodiode as set forth in claim 8 wherein said electrically conductive interconnect is comprised of indium.

* * * * *